US008255619B2

(12) United States Patent
Norman

(10) Patent No.: US 8,255,619 B2
(45) Date of Patent: *Aug. 28, 2012

(54) MEMORY DEVICE WITH VERTICALLY EMBEDDED NON FLASH NON VOLATILE MEMORY FOR EMULATION OF NAND FLASH MEMORY

(75) Inventor: Robert Norman, Pendleton, OR (US)

(73) Assignee: Unity Semiconductor Corporation, Sunnyvale Corporation, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/303,016

(22) Filed: Nov. 22, 2011

(65) Prior Publication Data

US 2012/0069665 A1    Mar. 22, 2012

Related U.S. Application Data

(63) Continuation of application No. 13/065,823, filed on Mar. 29, 2011, now Pat. No. 8,065,474, which is a continuation of application No. 12/925,631, filed on Oct. 25, 2010, now Pat. No. 7,917,691, which is a continuation of application No. 12/004,192, filed on Dec. 20, 2007, now Pat. No. 7,822,913.

(51) Int. Cl.
*G06F 12/00* (2006.01)
(52) U.S. Cl. ...................................... 711/103
(58) Field of Classification Search ............ None
See application file for complete search history.

(56) References Cited

U.S. PATENT DOCUMENTS

| | | | | |
|---|---|---|---|---|
| 6,034,882 A * | 3/2000 | Johnson et al. | | 365/103 |
| 6,507,514 B1 * | 1/2003 | Tsao et al. | | 365/185.17 |
| 6,704,230 B1 * | 3/2004 | DeBrosse et al. | | 365/201 |
| 6,967,870 B2 * | 11/2005 | Jenq et al. | | 365/185.17 |
| 7,327,600 B2 * | 2/2008 | Norman | | 365/158 |
| 7,460,385 B2 * | 12/2008 | Gruber et al. | | 365/51 |
| 7,822,913 B2 * | 10/2010 | Norman | | 711/103 |
| 7,917,691 B2 * | 3/2011 | Norman | | 711/103 |
| 8,065,474 B2 * | 11/2011 | Norman | | 711/103 |
| 2003/0151959 A1 * | 8/2003 | Tringali et al. | | 365/200 |
| 2008/0084727 A1 * | 4/2008 | Norman | | 365/63 |
| 2008/0285350 A1 * | 11/2008 | Yeh | | 365/185.17 |

* cited by examiner

*Primary Examiner* — Hiep Nguyen
(74) *Attorney, Agent, or Firm* — Stolowitz Ford Cowger LLP

(57) ABSTRACT

A system and a method for emulating a NAND memory system are disclosed. In the method, a command associated with a NAND memory is received. After receipt of the command, a vertically configured non-volatile memory array is accessed based on the command. In the system, a vertically configured non-volatile memory array is connected with an input/output controller and a memory controller. The memory controller is also connected with the input/output controller. The memory controller is operative to interface with a command associated with a NAND memory and based on the command, to access the vertically configured non-volatile memory array for a data operation, such as a read operation or write operation. An erase operation on the vertically configured non-volatile memory array is not required prior to the write operation. The vertically configured non-volatile memory array can be partitioned into planes, blocks, and sub-planes, for example.

20 Claims, 6 Drawing Sheets

106

| Memory Plane n | 250 |
| ... | |
| Memory Plane 1 | 250 |
| Memory Plane 0 | 250 |
| Logic | 252 |

| 250 | | 406 | 404 |
| 250 | | ... | 404 |
| 250 | | 406 | 404 |
| 250 | | 406 | 404 |
| | Logic | 252 | |

FIG. 3

MEMORY DEVICE WITH VERTICALLY EMBEDDED NON FLASH NON VOLATILE MEMORY FOR EMULATION OF NAND FLASH MEMORY

FIELD OF THE INVENTION

The present invention relates to semiconductors and, more particularly, to the emulation of a NAND memory system.

BACKGROUND

Not AND (NAND) flash memory is a non-volatile solid state memory that does not need power to maintain data stored in the memory. Such feature makes NAND memory a popular storage solution for a variety of devices, such as removable storage cards, cell phones, MPEG-1 Audio Layer 3 (MP3) players, and other devices. Accessing a NAND memory may include programming (or writing) a page of data, reading a page of data, and erasing a block of data. A device may access a NAND memory with standard NAND commands. For example, a NAND memory may respond to a set of NAND commands such as read status, program page, page read, and other commands.

A limitation of NAND memory is the erasure of data. The application of an erase pulse to memory cells associated with a NAND memory that are not programmed (i.e., a zero logical state) drives the memory cells into a deep erased state. The erase pulse may therefore result in over erased memory cells that can cause errors in programming. To overcome such limitation, an extra programming operation of all memory cells to a one logical state is conducted before an erase operation. Such extra programming operation before an erase operation lengthens the time period of an erase operation.

Additionally, another limitation of NAND memory is that NAND memory does not allow changes to bit values at random. Thus, to perform a write operation, the NAND memory requires an erase operation before the write operation. Such additional erase operation before a write operation lengthens the time period of a write operation. As a result, there is a need for continuing efforts to improve a NAND memory system.

BRIEF DESCRIPTION OF THE DRAWINGS

The present invention will be readily understood by the following detailed description in conjunction with the accompanying drawings, and like reference numerals designate like structural elements. Although the Drawings depict various examples of the invention, the invention is not limited by the depicted examples. Furthermore, the depictions are not necessarily to scale.

FIG. 2 is a simplified block diagram of a vertically configured non-volatile memory array, in accordance with an embodiment.

FIG. 3 is a simplified block diagram of a general file structure that may be used with vertically configured non-volatile memory array, in accordance with an embodiment.

DETAILED DESCRIPTION

A detailed description of one or more embodiments is provided below along with accompanying figures. The detailed description is provided in connection with such embodiments, but is not limited to any particular embodiment. The scope is limited only by the claims and numerous alternatives, modifications, and equivalents are encompassed. Numerous specific details are set forth in the following description in order to provide a thorough understanding. These details are provided for the purpose of example and the described embodiments may be implemented according to the claims without some or all of these specific details. For the purpose of clarity, technical material that is known in the technical fields related to the embodiments has not been described in detail to avoid unnecessarily obscuring the description.

The embodiments described herein provide memory systems and methods for the emulation of a NAND memory system. As explained in more detail below, a vertically configured non-volatile memory array may be accessed based on commands associated with a NAND memory. Memory systems with vertically configured non-volatile memory arrays are described below for interfacing with devices that use a NAND memory interface and protocol system.

Figure 1:
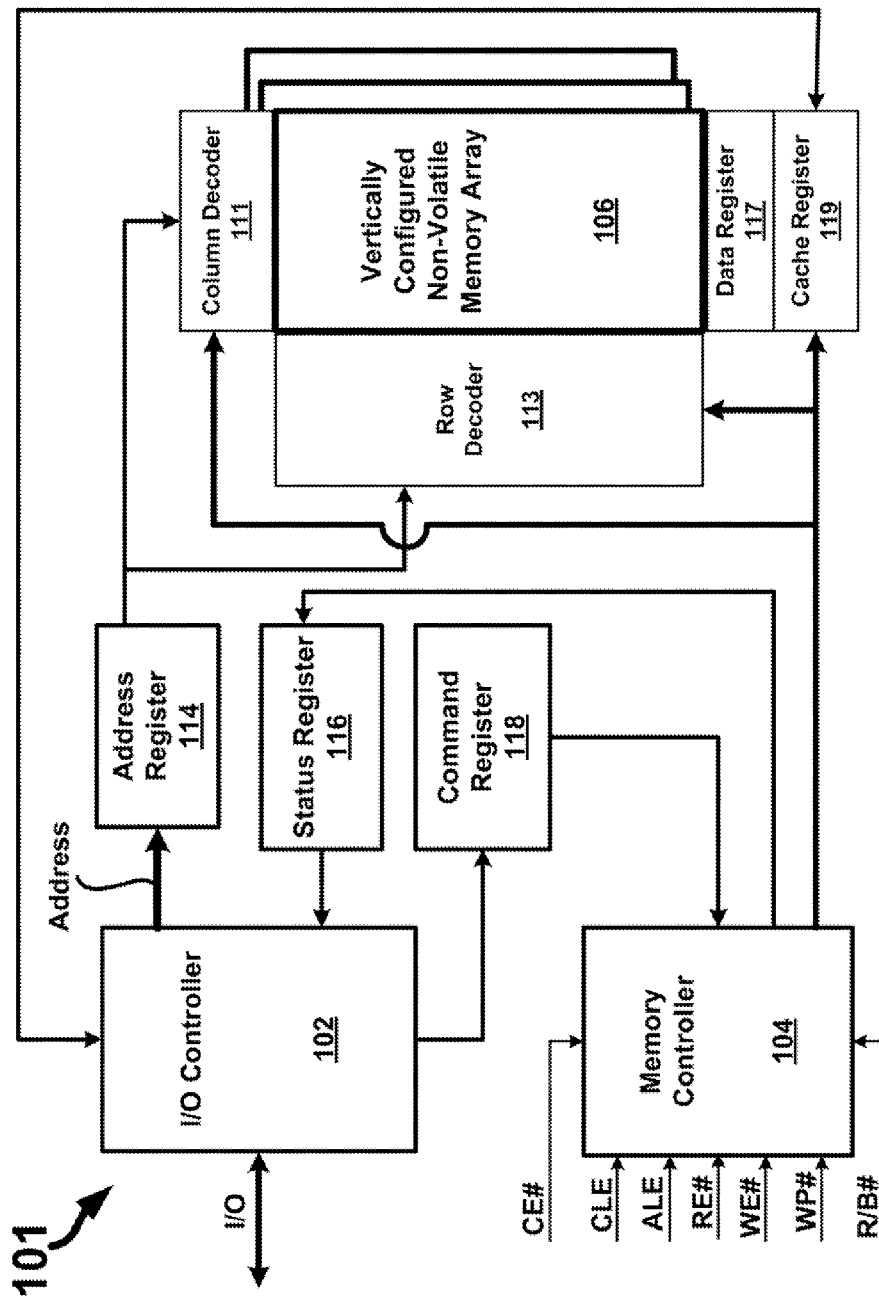
FIG. 1 is a simplified block diagram of a memory system, in accordance with an embodiment.

FIG. 1 is a simplified block diagram of a memory system, in accordance with an embodiment. As shown in FIG. 1, system 101 may include input/output (I/O) controller 102, memory controller 104, vertically configured non-volatile memory array 106, address register 114, status register 116, and command register 118. Vertically configured non-volatile memory array 106 is connected to or in communication with I/O controller 102 and memory controller 104. In general, I/O controller 102 may be configured to control the transfer of data, memory addresses, and instructions. For example, the transfer may be bi-directional where data is output from I/O controller 102 during read operations and, at other times, the data is inputted into the I/O controller 102. Vertically configured non-volatile memory array 106, as explained in more detail below, can include a memory array that may be vertically configured along multiple memory planes. Memory controller 104 may be configured to interface with a command associated with a NAND memory and configured to access vertically configured non-volatile memory array 106 based on the command. Status register 116 is configured to store bits that indicate the status of memory controller 104 (e.g., a high (or logic "1" value) for busy or low (or logic "0" value) for not busy). Command register 118 and address register 114 are configured to store a command and a memory address, respectively, received by I/O controller 102.

Memory controller 104 may have x8 or x16 data lines and a set of control lines to interface with commands associated with a NAND memory. For example, memory controller 104 may include control lines CLE (Command latch enable), ALE (Address latch enable), and CE# (Chip enable) to control interface access. Additionally included in memory controller 104 are control lines WP# (Write protect), WE# (Write enable), R/B # (Read/Busy), and RE# (Read enable) for memory access control. Memory controller 104 interfaces with vertically configured non-volatile memory array 106 by multiplexing the data lines between command, memory address, and data. In other words, memory controller 104 can access vertically configured non-volatile memory array 106 by toggling the control pins. For example, when CLE is high, data (or commands) are transferred from I/O controller 102 to command register 118 on the rising edge of WE#. When ALE is high, address information (e.g., memory address) is transferred from I/O controller 102 into address register 114 upon a low-to-high transition on WE#. In regard to WP#, write and erase operations are disabled when WP# is low. If vertically configured non-volatile memory array 106 is busy, then R/B# may be low.

It should be appreciated that through the use of the control lines, memory controller 104 can access vertically configured non-volatile memory array 106 based on commands associated with a NAND memory. Such commands are configured to access a NAND memory. Examples of commands include page read, page read cache first, page read cache last, read for internal data move, random data read, read identification, read status, program page, program page cache, program for internal data move, random data input for program, block erase, reset, and other commands. Such commands follow an interface protocol that, for example, loads commands in a first cycle, followed by a number of cycles of memory address, and then followed by the data.

FIG. 2 is a simplified block diagram of a vertically configured non-volatile memory array, in accordance with an embodiment. Vertically configured non-volatile memory array 106, which is connected to logic circuitry 252 and may be disposed above the logic circuitry 252, can include a memory array that is vertically configured along multiple memory planes 250. For example, memory planes 250 can be implemented that emulate various types of memory technologies that permit different physical and logical arrangements (e.g., vertically stacked). In general, vertically configured non-volatile memory array 106 may be a two-terminal cross-point array where, as shown in the embodiment of FIG. 2, memory arrays in the form of memory planes 250 may be stacked on top of logic circuitry 252. Vertically configured non-volatile memory array 106 allows for multiple memory planes 250 to be stacked upon one another and data may be read from and written to the memory planes, which may be further divided into memory sub-planes. In an embodiment, vertically configured non-volatile memory array 106 may be addressed as a continuous sequence. In other words, vertically configured memory array 106 may be addressed as one memory array instead of a memory array with multiple memory planes 250. Furthermore, vertically configured non-volatile memory array 106 allows changes to memory bits at random (i.e., random access) and allows for fast and low voltage program operations. By way of example, vertically configured non-volatile memory array 106 can program (or write) in less than about 100 nanoseconds using approximately ±3 volts. As used herein, the term "approximately" means that the specified dimension or parameter may be varied within an acceptable tolerance for a given application. For example, an acceptable tolerance is ±10%.

In some embodiments, memory technologies such as those disclosed in U.S. patent application Ser. No. 11/095,026, filed Mar. 30, 2005, now published U.S. application No. 2006/0171200, and titled "Memory Using Mixed Valence Conductive Oxides," hereby incorporated by reference in its entirety and for all purposes. The application describes a two-terminal memory element that changes conductivity when exposed to an appropriate voltage drop across the two terminals. A plurality of the two-terminal memory elements can be arranged in a cross-point array configuration. Multiple layers of the cross-point arrays may be vertically stacked upon one another to form the aforementioned vertically stacked array configuration. The memory element includes an electrolytic tunnel barrier and a mixed valence conductive oxide. The voltage drop across the electrolytic tunnel barrier causes an electrical field within the mixed valence conductive oxide that is strong enough to move oxygen ions out of the mixed valence conductive oxides and into the electrolytic tunnel barrier. Oxygen depletion causes the mixed valence conductive oxide to change its valence, which causes a change in conductivity. Both the electrolytic tunnel barrier and the mixed valence conductive oxide do not need to operate in a silicon substrate, and, therefore, can be fabricated above circuitry being used for other purposes (e.g., such as selection circuitry). The circuitry can be in a logic plane fabricated on a substrate (e.g., a silicon Si wafer) and the memory array can be positioned on top of the substrate. The memory element stores data as a plurality of conductivity profiles that can be non-destructively determined by applying a read voltage across the terminals of the memory element. The memory element retains stored data in the absence of power. The two-terminal memory elements can be arranged in a cross point array such that one terminal is electrically coupled with an x-direction line and the other terminal is electrically coupled with a y-direction line.

Both the electrolytic tunnel barrier and the mixed valence conductive oxide do not need to operate in a silicon substrate and, therefore, can be fabricated above circuitry being used for other purposes. The two-terminal memory elements can be arranged in a cross point array such that one terminal is electrically coupled with an x-direction line and the other terminal is electrically coupled with a y-direction line. A stacked cross point array consists of multiple cross point arrays vertically stacked upon one another, sometimes sharing x-direction and y-direction lines between layers, and sometimes having isolated lines. When a first write voltage $V_{W1}$ is applied across the memory element, (typically by applying $\frac{1}{2} V_{W1}$ to the x-direction line and $\frac{1}{2}-V_{W1}$ to the y-direction line) it switches to a low resistive state. When a second write voltage $V_{W2}$ is applied across the memory element, (typically by applying $\frac{1}{2} V_{W2}$ to the x-direction line and $\frac{1}{2}-V_{W2}$ to the y-direction line) it switches to a high resistive state. Typically, memory elements using electrolytic tunnel barriers and mixed valence conductive oxides require $V_{W1}$ to be opposite in polarity from $V_{W2}$.

FIG. 3 is a simplified block diagram of a general file structure that may be used with the vertically configured non-volatile memory array, in accordance with an embodiment. As shown in FIG. 3, each memory plane 250 associated with vertically configured non-volatile memory array 106 may include data section 406 and overhead section 404 to emulate the file structure of a NAND memory. Data is stored in data sections 406 and overhead sections 404 may contain information associated with the data sections 406. For example, overhead sections 404 may include logical block addressing (LBA) or cylinder, head, and sector. Tags associated with defects and locations (e.g., defect pointers and alternate sector pointers) and file addresses may additionally be included in overhead sections 404.

Figure 4A:
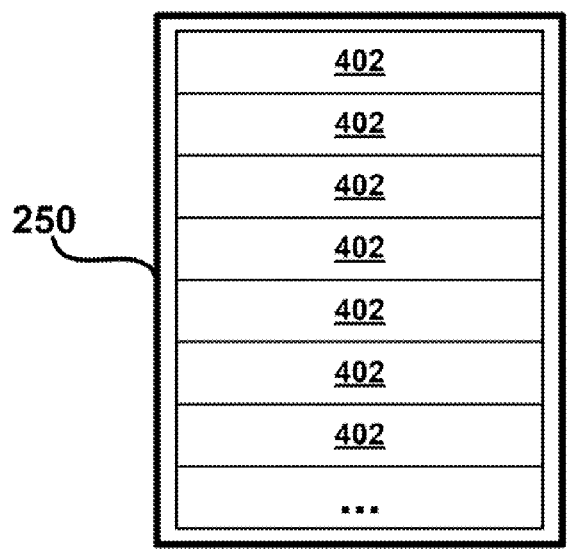
FIGS. 4A, 4B, and 4C are more detailed block diagrams of the file structure shown in FIG. 3, in accordance with an embodiment.
Figure 4B:
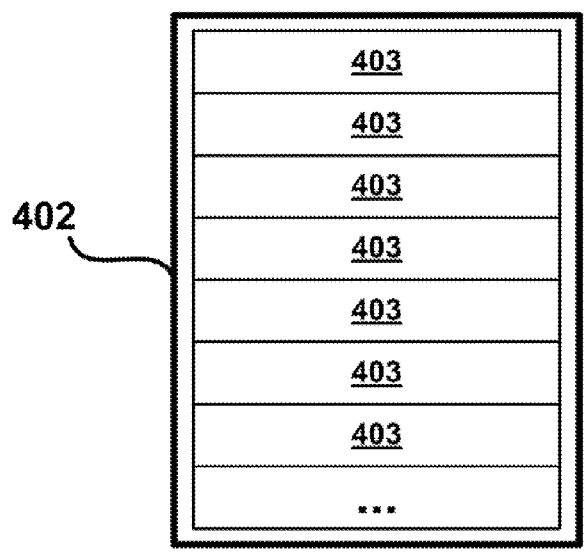
Figure 4C:
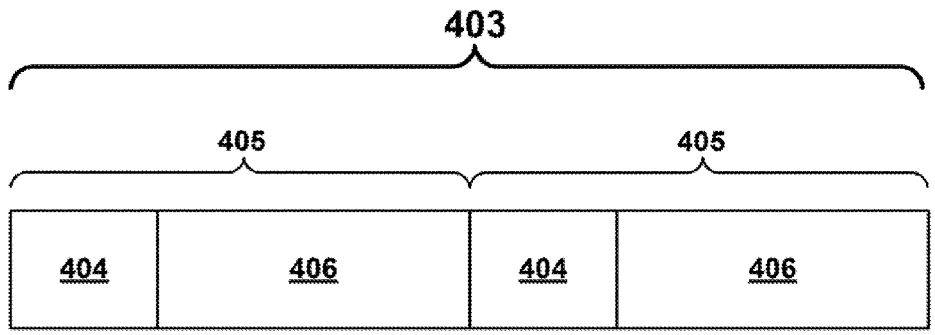

FIGS. 4A through 4C are more detailed block diagrams of the general file structure shown in FIG. 3, in accordance with an embodiment. The vertically configured non-volatile memory array includes a memory array that can be vertically configured along multiple memory planes. As shown in FIG. 4A, each memory plane 250 may be grouped or divided into a series of memory blocks 402 to emulate the memory structure of a NAND memory. Each memory plane 250 may include multiple memory blocks 402. For example, if the capacity of each memory block 402 is 64 Kbytes, then a 256

Mbytes memory plane 250 may be divided into 4,096 of the memory blocks 402. In another example, if the capacity of each memory block 402 is 64 Kbytes, then a 512 Mbytes memory plane 250 may be divided into 8,192 of the memory blocks 402.

As shown in FIG. 4B, memory blocks 402 may be further divided into pages 403. Each memory block 402 may include multiple pages 403. For example, if each page 403 is 1 Kbyte, then a 64 Kbytes memory block 402 may be divided into 64 of the pages 403. In another example, if each page 403 is 2 Kbytes, then a 128 Kbytes memory block 402 also may be divided into 64 of the pages 403. The pages 403 may further be divided into sectors to emulate a NAND memory structure. As shown in FIG. 4C, pages 403 additionally may be divided into sectors 405. Each page 403 may include multiple sectors 405. For example, each page 403 may include two, 512 Kbytes sectors 405. In another example, each page 403 may include four, 512 Kbytes sectors 405.

Each sector 405 may include data section 406 and an associated overhead section 404. Data is stored in data section 406 and overhead section 404 may contain information associated with the data section. For example, as discussed above, overhead sections 404 may include logical block addressing (LBA) or cylinder, head, and sector. Error correcting code, tags associated with defects and locations (e.g., defect pointers and alternate sector pointers), and file addresses may additionally be included in overhead sections 404.

Figure 5:
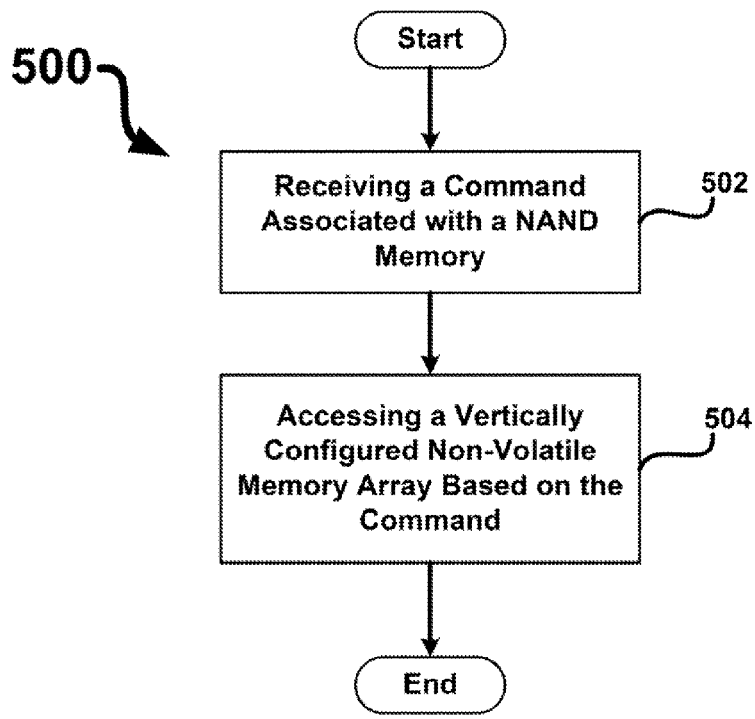
FIG. 5 is a flowchart diagram of a high level overview for emulating access of a NAND memory system, in accordance with an embodiment.

FIG. 5 is a flowchart diagram 500 depicting a high level overview for emulating access of a NAND memory system, in accordance with an embodiment. A memory system with a vertically configured non-volatile memory array, such as the memory system shown in FIG. 1, may be configured to interface with commands associated with NAND memory. At a stage 502 of FIG. 5, the memory controller associated with the memory system may include logic for receiving a command associated with a NAND memory. As discussed above, examples of commands associated with a NAND memory include page read, page read cache first, page read cache last, read for internal data move, and other commands.

With the receipt of the command associated with a NAND memory, the memory controller can access the vertically configured non-volatile memory array based on the command at a stage 504 of FIG. 5. In an embodiment, as explained in more detail below, the memory controller 104 (FIG. 1) may receive a block erase command to erase a memory block, but no erase operation is conducted on the vertically configured non-volatile memory array 106 (FIG. 1). In another embodiment, as explained in more detail below, memory controller 104 may receive a write command to write data, and the data is written to the vertically configured non-volatile memory array 106 without performing an erase operation before the write. It should be appreciated that there are a variety of different NAND interfaces and NAND file structures. The differences between the NAND interfaces may be emulated with different logic and protocols. The differences between the NAND file structures may be emulated with different grouping (or blocking) of the vertically configured non-volatile memory array 106.

Figure 6:
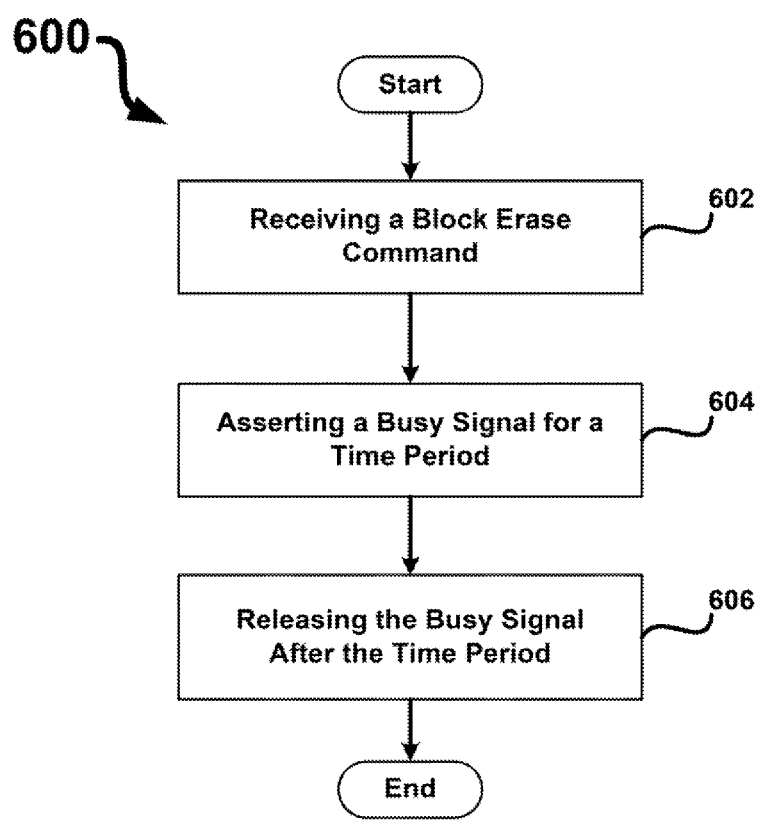
FIG. 6 is flowchart diagram of the emulation of an erase operation, in accordance with an embodiment.

FIG. 6 is flowchart diagram 600 depicting emulation of an erase operation, in accordance with an embodiment. As shown in FIG. 6, a block erase command associated with a NAND memory (e.g., block erase) is received at a stage 602. The block erase command instructs the memory controller 104 (FIG. 1) to erase a memory block and operates on one memory block at a time. With the receipt of the block erase command, at a stage 604, the memory controller 104 asserts a busy signal for a time period. For example, as shown in FIG. 1, a busy signal may be asserted for a time period by raising the R/B# signal to high, which is reflected in a status register bit stored in status register 116.

Returning to FIG. 6, after the time period, the memory controller 104 releases the busy signal at a stage 606. For example, the busy signal may be released by transitioning the R/B# signal from high to low. During the time period, an erase operation is not performed. In other words, between the assertion of the busy signal and the release of the busy signal, no erase operation is performed. An erase operation is not performed in response to a block erase command because, with a vertically configured non-volatile memory array, an erase operation is not needed. Instead, data may be written over existing data without an erase operation. In addition to not performing an erase operation, the memory controller 104 does not access the vertically configured non-volatile memory array 106 during the time period. By providing a delay in response to a block erase command, the memory controller 104 emulates the interface sequence of a block erase command associated with a NAND memory. The time period may span an amount of time that corresponds to a time for an erase operation with a NAND memory. For example, the time period can span from about 100 nanoseconds to about 10 milliseconds. The time period may be defined by a user. For example, a user may set a minimum time period (e.g., 100 nanoseconds) for a fast erase operation when compared to the time for an erase operation of a NAND memory. Alternatively, the user may set a time period that matches the time for an erase operation of a NAND memory. The time period may be set by programming non-volatile registers in the memory system.

Figure 7:
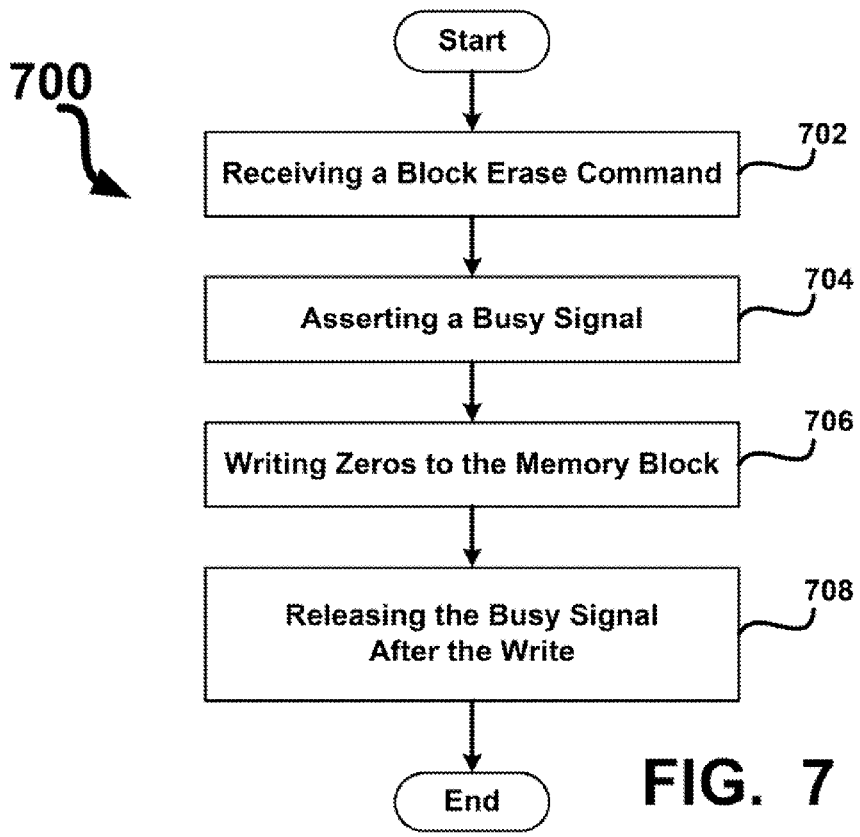
FIG. 7 is a flowchart diagram of the emulation of an erase operation, in accordance with another embodiment.

FIG. 7 is a flowchart diagram 700 of the emulation of an erase operation, in accordance with another embodiment. As shown in FIG. 7, a block erase command is received at a stage 702. With the receipt of the block erase command, the memory controller 104 (FIG. 1) asserts a busy signal at a stage 704 and writes zeros to the memory block at a stage 706. The zeros may be written to the memory block in operation 706 to emulate the results of an erase operation with a NAND memory. For example, after a memory block is erased in a NAND memory, the bits in the memory block may read as logical zeros. Subsequently, the memory block may be read in a verify operation to check whether the memory block is erased. For example, in a verify operation, a memory block with all bits reading as logical zeros indicates a successful erase operation. In contrast, a memory block with one or more bits reading as logical ones indicates a failed erase operation. Thus, in general, a verification operation detects logical ones that are not successfully erased to logical zeros. Accordingly, writing zeros to a memory block associated with a vertically configured non-volatile memory 106 (FIG. 1) can emulate a block erase command associated with a NAND memory, in accordance with an embodiment. After the memory controller 104 writes zeros to the memory block, the memory controller 104, at a stage 708, releases the busy signal. It should be appreciated that the write operation associated with a vertically configured non-volatile memory array 106 is faster than a write operation associated with a NAND memory. Therefore, in an embodiment, a user may match the time period for a write operation of a NAND memory by adding a delay time period before the busy signal such as to increase the time period from a busy to a ready response.

In an embodiment, the memory controller 104 may write zeros to both a data section and an overhead section associated with a memory block. For example, as shown in FIG. 4C, zeros may be written to data sections 406 and overhead sections 404 of sectors 405 associated with a memory block. In another embodiment, the memory controller 104 may write zeros to the data section associated with a memory block. In other words, the zeros are written to the data sections but not to the overhead sections, thereby leaving the overhead sections unchanged. For example, as shown in FIG. 4C, zeros may be written to data sections 406 of sectors 405 associated with a memory block. In still another embodiment, the memory controller may write zeros to the overhead sections but not the data sections. For example, as shown in FIG. 4C, zeros may be written to overhead sections 404 of sectors 405 associated with a memory block.

Figure 8:
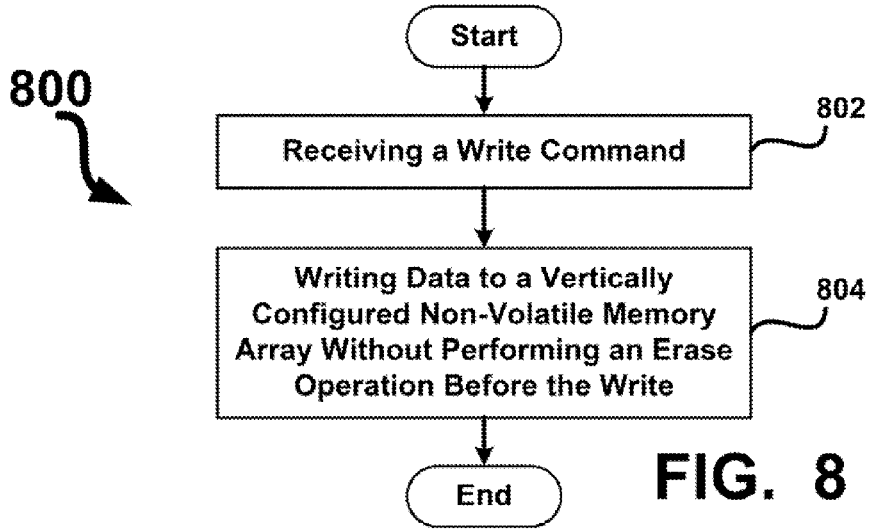
FIG. 8 is flowchart diagram of the emulation of a write operation, in accordance with an embodiment.

FIG. 8 is flowchart diagram 800 depicting emulation of a write operation, in accordance with an embodiment. As shown in FIG. 8, a write command associated with a NAND memory to write data (e.g., program page, program page cache, program for internal data move) is received at a stage 802. The data is written to a memory address. After the data and the memory address are received, the data is written to the vertically configured non-volatile memory array 106 (FIG. 1) at a stage 804 without performing an erase operation before the write operation. The data is written to the non-volatile memory array 106 at the memory address without erasing the data stored in the non-volatile memory array 106 at the memory address before the data is written. In other words, a write operation may be performed without an erase operation before the write operation.

As a result, data can be written directly to the non-volatile memory array 106 and write operations can be performed without erase operations interrupting the write operations. For example, write operations can be performed continuously without performing erase operations between the write operations. In other words, a succession or series of write operations can be performed following one write operation after another write operation without gaps of erase operations performed between the write operations.

For example, as depicted in FIG. 1, I/O controller 102 receives a write command in a write operation and the write command is loaded into command register 118. Following the write command, I/O controller 102 receives the memory address and then the data. The data may be loaded on consecutive WE# cycles starting at the given memory address. The data is then written to vertically configured non-volatile memory array 106 without performing an erase operation before the data is written. During the duration of the write operation, R/B# signal is low. After the completion of the write operation, the R/B# signal is high. As discussed above, a delay time period may be added before the assertion of the busy signal (or R/B# signal) to emulate the time period of a write operation associated with a NAND memory. A non-volatile register setting may be used to program the delay time period.

The above-described embodiments provide memory systems and methods for the emulation of a NAND memory system. With a vertically configured non-volatile memory system that accepts and interfaces with commands associated with a NAND memory, such memory system can replace a NAND memory system in a device that is compatible with NAND memory. In other words, a NAND memory system in a device that uses NAND memory can be substituted with the vertically configured non-volatile memory system described above. The vertically configured non-volatile memory array does not require extra erase operations before write operations and does not require an extra programming operation of all memory cells to a one logical state before an erase operation. The lack of the extra operations can result in reduced logic and fast access operations (e.g., erase and write operations). The performance of a device that uses NAND memory can therefore be improved by substituting the NAND memory with a vertically configured non-volatile memory array. Furthermore, the stacked memory planes associated with a vertically configured non-volatile memory array provide a small die size, thereby reducing the cost of the memory system. The vertically configured non-volatile memory array also does not program with high voltages and does not require erase operations. As a result, the substitution of the NAND memory with a vertically configured non-volatile memory array results in reduced power consumption.

Although the foregoing embodiments have been described in some detail for purposes of clarity of understanding, the embodiments are not limited to the details provided. There are many alternative ways of implementing the embodiments. Accordingly, the disclosed embodiments are to be considered as illustrative and not restrictive, and the embodiments are not to be limited to the details given herein, but may be modified within the scope and equivalents of the appended claims. In the claims, elements and/or operations do not imply any particular order of operation, unless explicitly stated in the claims.

What is claimed is:

1. A method for write operation emulation on embedded non-Flash non-volatile memory without using a Flash erase operation, comprising:
    receiving a write command, the write command including write data and at least one write address; and
    writing the write data, starting at the at least one write address, to one or more of a plurality of vertically configured re-writeable non-volatile memory arrays, each memory array is embedded in one of a plurality of vertically stacked memory planes, wherein writing the write data occurs without performing an erase operation before the writing, and
    wherein the plurality of vertically stacked memory planes are in contact with one another and integrally fabricated directly above a silicon semiconductor substrate including circuitry fabricated on the silicon semiconductor substrate, at least a portion of the circuitry is electrically coupled with the plurality of vertically configured re-writeable non-volatile memory arrays and is operative to perform the writing.

2. The method of claim 1, wherein the writing comprises one or more write operations to one or more of the plurality of vertically configured re-writeable non-volatile memory arrays and the write operations are performed continuously without performing any erase operations between successive write operations.

3. The method of claim 1, wherein the write data is loaded into a data register on consecutive write enable cycles.

4. The method of claim 1, wherein the write command comprises a command selected from the group consisting of program page, program page cache, program for internal data move, random data input for program, block erase, and reset.

5. The method of claim 1, wherein the receiving write command comprises loading the write command in a first cycle, loading the at least one write address in one or more cycles, and loading the write data in one or more additional cycles.

6. The method of claim 1, wherein the circuitry includes an input/output (I/O) controller and a memory controller in electrical communication with each other, the I/O controller and the memory controller are in electrical communication with the plurality of vertically configured re-writeable non-volatile memory arrays, the memory controller is configured to interface with a command associated with NAND Flash memory, and based on the command, to access one or more of the plurality of vertically configured re-writeable non-volatile memory arrays for a data operation.

7. The method of claim 1, wherein the write data comprises instructions to be stored in one or more of the plurality of vertically configured re-writeable non-volatile memory arrays.

8. The method of claim 1, wherein one or more of the plurality of vertically configured re-writeable non-volatile memory arrays are divided into a plurality of memory blocks.

9. The method of claim 8, wherein each memory block is divided into a plurality of pages.

10. The method of claim 9, wherein each page is divided into a plurality of sectors.

11. The method of claim 10, wherein each sector includes an overhead section and a data section.

12. The method of claim 1, wherein each vertically configured re-writeable non-volatile memory array includes a plurality of first conductive array lines and a plurality of second conductive array lines, and the first and second conductive array lines are electrically coupled with the portion of the circuitry.

13. The method of claim 12 and further comprising:
a plurality of re-writable two-terminal non-volatile memory elements having exactly two terminals and positioned in each vertically configured re-writeable non-volatile memory array, each memory element is positioned between a cross-point of one of the plurality of first conductive array lines with one of the plurality of the second conductive array lines, each memory element is directly electrically in series with its respective first and second conductive array lines, a write operation to each memory element does not require a prior erase operation to the memory element, and each memory element configured to store at least one bit of data and to retain the data in the absence of electrical power.

14. The method of claim 13, wherein each of the plurality of re-writable two-terminal non-volatile memory elements includes a unique memory address within its respective memory array and each memory element is configured to be directly randomly accessed for a data operation by a data operation command received by the portion of the circuitry.

15. The method of claim 13, wherein each re-writable two-terminal non-volatile memory element includes a first terminal electrically coupled with its respective first conductive array line and a second terminal electrically coupled with its respective second conductive array line, and each memory element is directly electrically in series with its first and second terminals.

16. The method of claim 15, wherein each re-writable two-terminal non-volatile memory element includes a tunnel barrier layer in contact with the first terminal, an ion reservoir including mobile oxygen ions, the ion reservoir in contact with the second terminal and with the tunnel barrier layer, and the tunnel barrier layer and the ion reservoir are directly electrically in series with the first and second terminals.

17. The method of claim 16, wherein the tunnel barrier layer includes a thickness that is less than 50 Å.

18. The method of claim 16, wherein the ion reservoir comprises a layer of conductive metal oxide (CMO).

19. The method of claim 18, wherein the layer of CMO comprises a perovskite.

20. The method of claim 13, wherein each re-writable two-terminal non-volatile memory element is operative to store data as a plurality of conductivity profiles that are retained in the absence of electrical power, the data is reversibly written by applying a write voltage across the first and second terminals, and the data can be non-destructively determined by applying a read voltage across the first and second terminals.

* * * * *